United States Patent
Nicolaescu et al.

(10) Patent No.: US 8,476,602 B2
(45) Date of Patent: Jul. 2, 2013

(54) MAGNET FOR ION BEAM IRRADIATION APPARATUS EQUIPPED WITH PROTECTIVE MEMBER THAT COVERS PLURALITY OF MAGNETIC FIELD CONCENTRATING MEMBERS

(75) Inventors: Dan Nicolaescu, Kyoto (JP); Masao Naito, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 58 days.

(21) Appl. No.: 12/966,545

(22) Filed: Dec. 13, 2010

(65) Prior Publication Data
US 2011/0204250 A1     Aug. 25, 2011

(30) Foreign Application Priority Data

Feb. 23, 2010  (JP) ................................. 2010-037138
Sep. 29, 2010  (JP) ................................. 2010-218429

(51) Int. Cl.
*H01J 37/143*    (2006.01)

(52) U.S. Cl.
CPC ..................................... *H01J 37/143* (2013.01)
USPC .................................................. 250/396 ML

(58) Field of Classification Search
USPC ................................................. 250/396 ML
See application file for complete search history.

(56) References Cited

U.S. PATENT DOCUMENTS

| | | | |
|---|---|---|---|
| 4,382,183 A * | 5/1983 | Kimura ......................... 250/310 |
| 6,703,628 B2 | 3/2004 | Ye et al. |
| 6,762,423 B2 | 7/2004 | Liebert et al. |
| 6,794,661 B2 * | 9/2004 | Tsukihara et al. ........ 250/492.21 |
| 6,797,968 B2 * | 9/2004 | Tsukihara et al. ........ 250/492.21 |
| 7,459,692 B2 * | 12/2008 | Renau et al. ............ 250/396 ML |
| 7,655,922 B2 | 2/2010 | Smatlak et al. |
| 7,692,139 B2 | 4/2010 | Koo et al. |
| 7,834,326 B2 * | 11/2010 | Kawasaki et al. ....... 250/396 ML |
| 8,049,182 B2 * | 11/2011 | Bewick ................. 250/396 ML |
| 2004/0084635 A1 * | 5/2004 | Liebert et al. ............ 250/492.21 |
| 2009/0026390 A1 | 1/2009 | Benveniste et al. |
| 2009/0039281 A1 * | 2/2009 | Kawasaki et al. ......... 250/396 R |
| 2009/0179158 A1 * | 7/2009 | Stone et al. ................ 250/423 R |
| 2009/0251258 A1 * | 10/2009 | Rhinefrank et al. .......... 335/306 |

* cited by examiner

*Primary Examiner* — Jack Berman
*Assistant Examiner* — Eliza Osenbaugh-Stewart
(74) *Attorney, Agent, or Firm* — Procopio, Cory, Hargreaves & Savitch LLP

(57) ABSTRACT

A magnet used in an ion beam irradiation apparatus includes a pair of magnetic poles arranged facing each other on an inner side of the magnet across an ion beam; a plurality of magnetic field concentrating members that are arranged on each of the opposing surfaces of the magnetic poles and that perform a function of trapping electrons between the magnetic poles; and a protective member that covers opposing surfaces of the magnetic field concentrating members.

9 Claims, 14 Drawing Sheets

MAGNET FOR ION BEAM IRRADIATION APPARATUS EQUIPPED WITH PROTECTIVE MEMBER THAT COVERS PLURALITY OF MAGNETIC FIELD CONCENTRATING MEMBERS

BACKGROUND OF THE INVENTION

1. Field of the Invention

The present invention relates to a structure used in an ion beam irradiation apparatus to trap electrons within a magnet that deflects, scans, converges, or disperses ion beams.

2. Description of the Related Art

As one of the actions taken in response to a growing demand in recent years for improved productivity of ion beam irradiation apparatuses, focus is being placed on a technology for improving a transport efficiency of a low-energy ion beam having a positive charge. More specifically, a technology is available for suppressing a divergence of an ion beam that is passing through a magnet caused by a space charge effect by trapping electrons within the magnet used in the ion beam irradiation apparatus.

An example of such a technology is disclosed in Japanese Patent Application Laid-open No. 2008-521208 (Paragraphs 0020 to 0022, FIGS. 2 to 6) (hereinafter, "Patent Document 1"). Patent Document 1 discloses an analysis magnet that includes a plurality of magnetic field concentrating members arranged on opposing faces of magnetic pole members that are arranged.

The magnetic field concentrating members have ridges and grooves that produce a magnetic mirror effect inside the analysis magnet. Due to the magnetic mirror effect, when electrons moving along a magnetic field produced between the magnetic pole members approach one magnetic pole member, these electrons are reflected to the other magnetic pole member due to the influence of a concentrated magnetic field formed by the magnetic field concentrating members. Thereafter, the reflected electrons again move towards the first magnetic pole member along the magnetic field produced between the magnetic pole members. When the electrons approach the first magnetic pole member, these electrons are once again reflected in the opposite direction by the concentrated magnetic field of the magnetic field concentrating members. Thus, the electrons are trapped within the magnet by a combination of the movement of the electrons between the magnetic pole members and the reflection of the electrons by the magnetic field concentrating members.

However, even if the electrons are successfully trapped within the magnet according to the technology disclosed in Patent Document 1, the productivity of the ion beam irradiation apparatus cannot necessarily be improved merely by that alone.

Typically, the gap between the magnetic pole members is set keeping in view the size of the ion beam that is to be passed between the magnetic pole members, and is set slightly wider than the size of the ion beam. This configuration adapted to produce an adequately uniform magnetic field all over the ion beam.

Ion beams have a tendency to diverge due to a space charge effect. Therefore, even if divergence of the ion beam is suppressed by trapping the electrons within the magnet, the divergence cannot be suppressed completely, and there is always a slight divergence. Furthermore, even though an ion beam is perceived as a whole to travel in a straight line, the ion beam includes local beam components that travel in different directions. Therefore, a possibility of the ion beam colliding with the magnetic field concentrating members arranged on the magnetic pole members while passing through the gap between the magnetic pole members can be high.

Collision of the ion beam with the magnetic field concentrating members causes sputtering of the magnetic field concentrating members, resulting in their deformation. The deformed magnetic field concentrating members cannot produce sufficiently concentrated magnetic field, thus the trapping of the electrons deteriorates. To continue to maintain a good trapping effect, the deformed magnetic field concentrating members must be replaced with new ones. Because an operation of the ion beam irradiation apparatus needs to be stopped during replacement of the magnetic field concentrating members, the productivity of the ion beam irradiation apparatus drops.

Furthermore, the sputtering of the magnetic field concentrating members due to the ion beam causes the sputtered material to scatter as particles. If the magnetic field concentrating members are made of metal, the scattered metal particles of the magnetic field concentrating members contaminate the substrate that is to be irradiated by the ion beam, resulting in metal contamination, which is considered a fatal flaw in the manufacturing of semiconductor devises. This increases a failure rate of manufacturing of the semiconductor devises, resulting in a drop in the productivity of the ion beam irradiation apparatus.

SUMMARY OF THE INVENTION

The present invention presents solutions to the above-described problems. The principal object of the present invention is to accomplish trapping the electrons within the magnet without any adverse effect on the productivity of the ion beam irradiation apparatus.

According to an aspect of the present invention, there is provided a magnet used in an ion beam irradiation apparatus. The magnet includes a pair of magnetic poles arranged facing each other on an inner side of the magnet across an ion beam; a plurality of magnetic field concentrating members that are arranged on each of the opposing surfaces of the magnetic poles and that perform a function of trapping electrons between the magnetic poles; and a protective member that covers opposing surfaces of the magnetic field concentrating members.

Due to such a structure, because the magnetic field concentrating members are not directly sputtered by the ion beam, their deformation can be prevented. Because the magnetic field concentrating members are not deformed, their electron trapping function is not adversely affected. Thus, the need for stopping the apparatus for replacing the magnetic field concentrating members does not arise. Furthermore, even if the magnetic field concentrating members are made of metal, there is no danger of metal contamination because there is no sputtering. Thus, the electrons can be trapped within the magnet without any adverse effect on a productivity of the ion beam irradiation apparatus.

It is preferable that the protective member and the magnetic field concentrating members are formed integral with each other.

Due to such a structure, the protective member can be attached to or detached from the magnetic pole at the same time as when the magnetic field concentrating members can be attached to or detached from the magnetic pole. Thus, maintenance task, which requires attaching and detaching these members, can be performed easily.

It is preferable that, assuming an XYZ orthogonal coordinate system in which a designed traveling direction of the ion beam passing between the magnetic poles to be an X direction, a direction in which the magnetic poles are arranged to be a Y direction, and a direction that is orthogonal to both the X direction and the Y direction to be a Z direction, a groove is formed in each of two side surfaces of the protective member that intersect with the Z direction, and the magnet further includes a holding member that includes a first end and a second end, the first end being fixed to the magnetic pole and the second end being inserted into the groove in the protective member.

A structure in which the protective member has a concave portion formed on a surface thereof that faces the ion beam, with one edge of the holding member fixed to the magnetic pole and the other edge arranged in the concave portion can also be adopted.

Due to this structure, because the protective member is attached to the magnetic pole by using the holding member to slide the protective member, a time required for making position adjustment of the protective member during attachment can be reduced.

It is preferable that, the protective member has a projecting member is formed in the protective member, with a height thereof from a surface of the magnetic pole that faces the ion beam gradually decreasing in the designed traveling direction of the ion beam passing between the magnetic poles.

Due to this structure, the protective member that is arranged above the magnetic field concentrating members does not get sputtered and worn out even if the ion beam irradiation apparatus is operated for long periods of time. Consequently, an electron trapping effect within the magnet can be maintained for long periods.

Carbon nanotubes can be provided on the projecting sections.

Due to such a structure, divergent components of the ion beam can be prevented from reaching a wafer or a glass substrate, which is a target of irradiation by the ion beam.

Furthermore, the protective member can include a plurality of members.

Typically, a planar shape of the magnetic pole is curved in a complex manner along a designed trajectory of the ion beam passing between the magnetic poles. Due to this, in an arrangement in which the protective member is attached to the magnetic pole by sliding, depending on the shape of the magnetic pole and the protective member, the entire surface of the magnetic pole cannot be covered by sliding a single protective member thereon. In such cases, a plurality of protective members of shapes that is suitable for the shape of the magnetic pole and of sizes that can be easily slid can be separately attached to the magnetic pole by sliding. Due to such a structure, the protective members can be attached or detached easily.

According to the present invention having such a structure, electrons can be trapped within a magnet without any adverse effect on a productivity of an ion beam irradiation apparatus.

DETAILED DESCRIPTION OF THE PREFERRED EMBODIMENTS

Exemplary embodiments of the present invention are explained in detail below with reference to the accompanying drawings. The present invention is by no means limited to the embodiments explained below.

Figure 1:
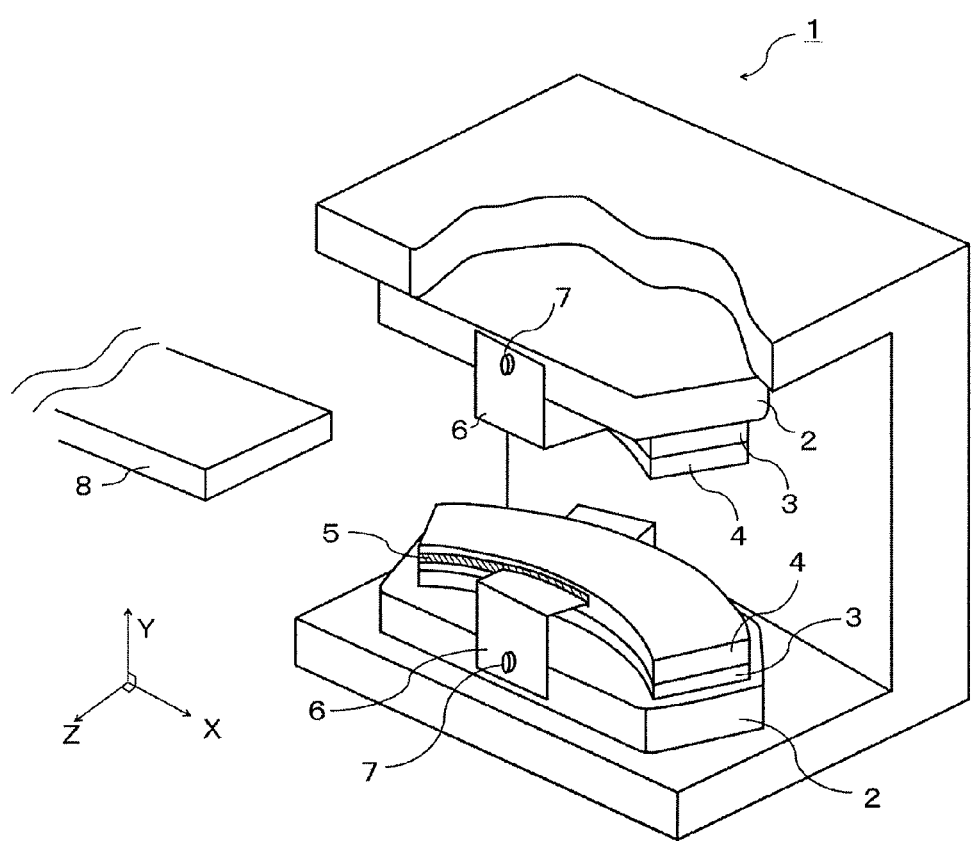
FIG. 1 is a perspective view of a magnet according to an embodiment of the present invention.

FIG. 1 is a perspective view of an entire magnet 1 according to an embodiment of the present invention. X, Y, and Z directions in FIG. 1 constitute an orthogonal coordinate system. The X direction represents a traveling direction of an ion beam 8 that becomes incident on the magnet 1.

A structure of the entire magnet 1 according the embodiment of the present invention is explained with reference to FIG. 1. As shown in FIG. 1, the ion beam 8 that travels along the X direction becomes incident on the magnet 1. The magnet 1 includes a pair of magnetic poles 2 arranged in the Y direction in such a way as to be arranged across the ion beam 8. The magnetic pole 2 is fixed to the magnet 1 by a bolt, etc.

On opposing surfaces of the magnetic poles 2, that is, on the surfaces of the magnetic poles 2 that face the ion beam 8 passing between the magnetic poles 2, magnetic field concentrating members 3 that trap electrons between the pair of the magnetic poles 2 by a mirror magnetic field are arranged, similar to the conventional technology. The magnetic field concentrating member 3 also is fixed to the magnetic pole 2 by a bolt, etc. For the sake of simplification, the magnetic field concentrating member 3 constitutes one member in FIG. 1; however, the magnetic field concentrating member 3 can constitute a plurality of members. Furthermore, in FIG. 1, the magnetic field concentrating member 3 is arranged only a portion of the surface of the magnetic pole 2; however, the magnetic field concentrating member 3 can be arranged on the entire surface of the magnetic pole 2.

A protective member 4 entirely covers the surface of the magnetic field concentrating member 3 that faces the ion beam 8 passing between the magnetic poles 2.

The protective member 4 is operative to trap the electrons within the magnet 1 without any adverse effect on a productivity of an ion beam irradiation apparatus.

Carbon, which is resistant to sputtering by the ion beam 8, can be used for the protective members 4. Silicon can be used for the protective members 4 if the target of irradiation by the ion beam 8 is a silicon wafer.

In the magnet 1 of FIG. 1, the protective member 4 is attached to the magnetic pole 2 by sliding. A groove 5 is provided on each of the two side surfaces of the protective member 4 in the Z direction.

A holding member 6 is provided on each of the two surfaces of the magnetic pole 2 in the Z direction. One end of the holding member 6 is fixed to the magnetic pole 2 by a stopper 7, such as a bolt. The other end of the holding member 6 is inserted into the groove 5 in the protective member 4. The protective member 4 is attached to the magnetic pole 2 by sliding, with the other end of the holding member 6 inserted into the groove 5. In FIG. 1, the attachment is realized by sliding the protective member 4 in a direction that is opposite to the traveling direction of the ion beam 8.

The groove 5 can be of any shape as long as it allows the protective member 4 to be attached by sliding. In FIG. 1, the groove 5 is shown only in one portion of the side surface of the protective member 4; however, the groove 5 can be provided in the entire length of the side surface of the protective member 4.

Figure 2:
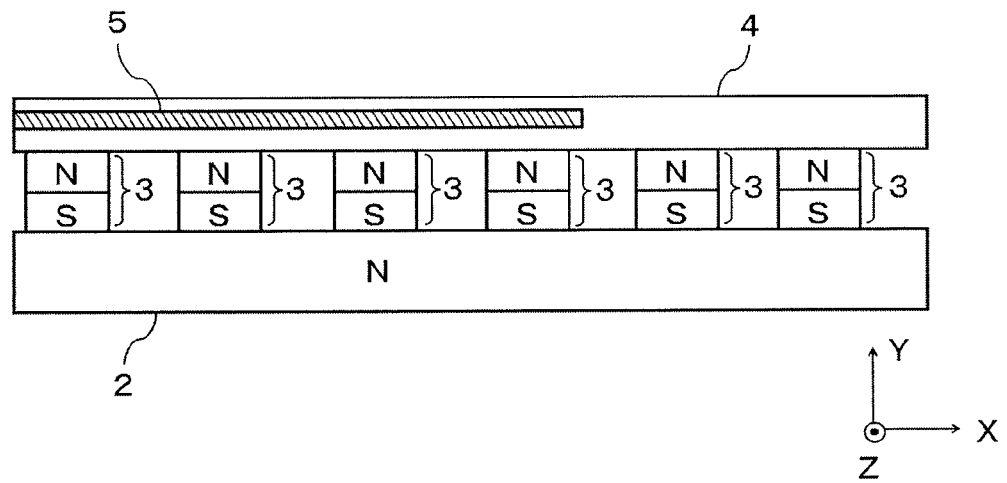
FIG. 2 is a drawing of a protective member according to the embodiment of the present invention in an XY plane.

FIG. 2 is a drawing of the protective member 4 in the XY plane. The holding member 6 is not shown in FIG. 2 in order for a relationship among the magnetic pole 2, the magnetic field concentrating members 3, and the protective member 4 be visible. Of the two magnetic poles 2, the magnetic pole 2 that is on the lower side in the Y direction is shown in FIG. 2. The structures of the magnetic field concentrating members 3, the protective members 4, and the holding members 6 that hold the protective members 4 arranged on the two magnetic poles 2 should preferably be the same. To avoid redundancy, only one magnetic pole and the members arranged thereon are explained in the embodiment according to the present invention.

As shown in FIG. 2, the magnetic field concentrating members 3 can be a plurality of permanent magnets. The magnetic field concentrating members 3 can be made of any material as long as they can produce concentrated magnetic field. The magnetic field concentrating members 3 can be arranged, as shown in FIG. 2, on a part of the surface of the magnetic pole 2. Alternatively, the magnetic field concentrating members 3 can be arranged on the entire surface of the magnetic pole 2. In the later configuration, the electrons can be more reliably trapped within the magnet 1.

Each magnetic pole 2 carries a different magnetic polarity thereby producing a magnetic field in one direction. The magnetic pole 2 shown in FIG. 2 has an N polarity. The permanent magnets that serve as the magnetic field concentrating members 3 are arranged such that their S poles are on the magnetic pole 2 side and their N poles are away from the magnetic pole 2 side. The permanent magnets that serve as the magnetic field concentrating member 3 are oriented in reverse on the magnetic pole 2 with an S polarity, that is, with their N pole on the magnetic pole 2 side and their S pole away from the magnetic pole 2 side.

The protective member 4 is arranged on upper surfaces (on the Y direction side) of the magnetic field concentrating members 3. A groove 5 is provided on each of the two side surfaces of the protective member 4 that intersect with the Z direction. One end of the holding member 6 is inserted into the groove 5 as shown in FIG. 1. In the present example, the protective member 4 can be made to fill even the gaps between the magnetic field concentrating members 3. However, the protective member 4 only covers the upper surfaces of the magnetic field concentrating members 3. In the structure shown in FIG. 2, the protective member 4 and the magnetic field concentrating members 3 are separate components, and are separately attached or detached.

As another example of the magnetic field concentrating members 3, an arrangement can be used in which a material with a high magnetic permeability and a material with a low magnetic permeability are arranged alternately. In this arrangement, the material with a high magnetic permeability can be arranged at the places occupied by the permanent magnets, and the material with a low magnetic permeability can be arranged at the gaps in FIG. 2. This arrangement can also be reversed, that is, the material with a high magnetic permeability can be arranged at the gaps, and the material with a low magnetic permeability can be arranged at the places occupied by the permanent magnets.

The gaps between the magnetic field concentrating members 3 can be further narrowed, and a carbon nanotube that includes a magnetic material can be arranged on the surface of the magnetic pole 2 so as to make a localized concentrated magnetic field more dense. For example, the carbon nanotube can be cut into rings, and arranged to stand upright on the surface of the magnetic pole 2, with a magnetic material such as a permanent magnet placed within the carbon nanotube.

Figure 3:
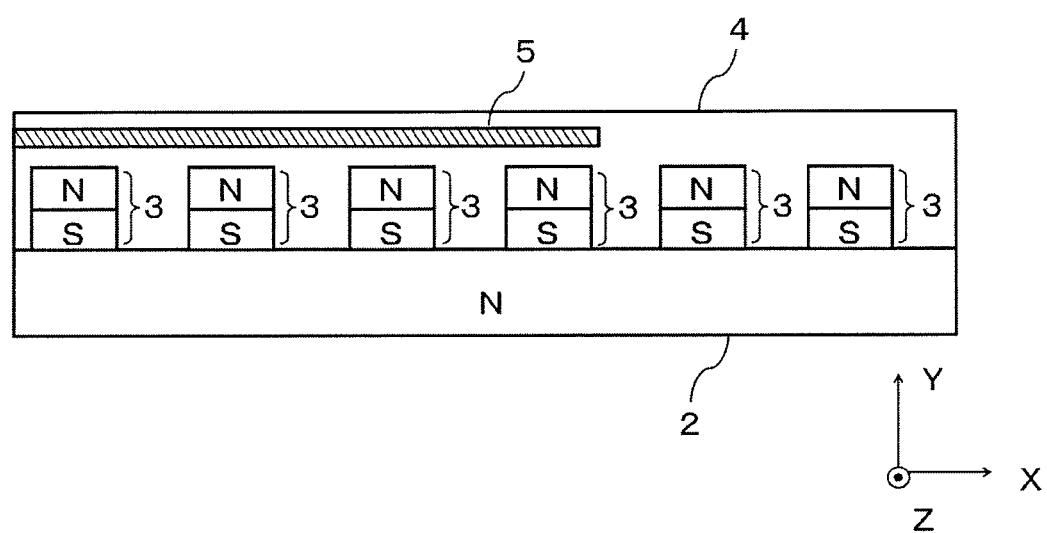
FIG. 3 is a drawing of a protective member according to another embodiment of the present invention in the XY plane.

FIG. 3 is a drawing of the protective member 4 according to another embodiment of the present invention in the XY plane.

In this embodiment, the magnetic field concentrating members 3 and the protective member 4 form an integrated entity. For example, the magnetic field concentrating members 3 are embedded within the protective member 4, thus differing from the structure shown in FIG. 2. This arrangement enables the integrated entity to be easily attached to or detached from the magnetic pole 2.

Figure 4:
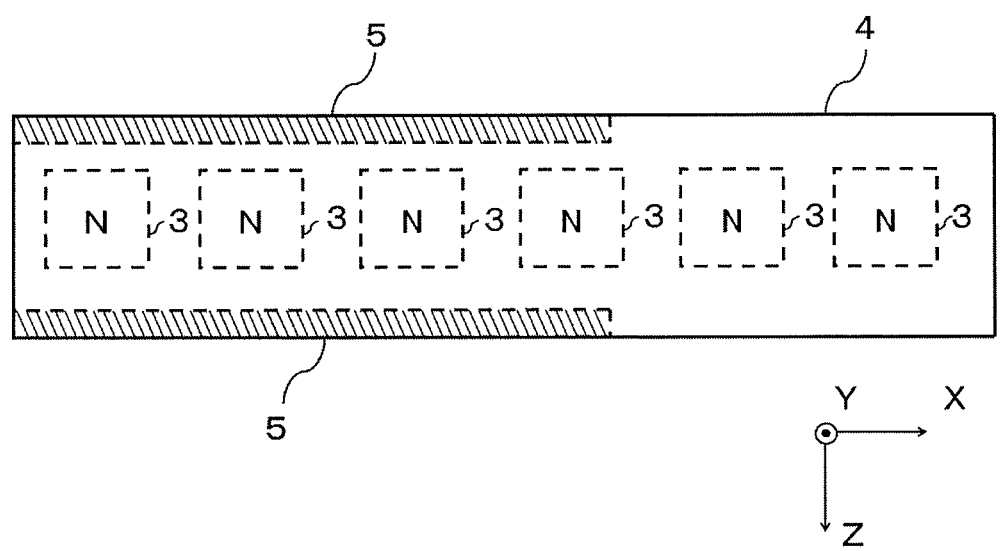
FIG. 4 is a drawing of the protective members shown in FIGS. 2 and 3 in a ZX plane.

FIG. 4 is a drawing of the protective member 4 shown in FIGS. 2 and 3 in the ZX plane. Because the protective member 4 covers the entire surface of the magnetic pole 2, in FIG. 4 the magnetic pole 2 does not appear. The protective member 4, however, only needs to cover the magnetic field concentrating member 3, and not the entire surface of the magnetic pole 2. It is only an example.

In FIG. 4, the grooves 5 and the magnetic field concentrating members 3 are outlined with dashed lines to make it easy to understand a positional relationship between them. These components cannot be viewed in actual unless the protective member 4 is made of a transparent material.

It may look from a glance at FIGS. 2 and 3 as if the grooves 5 and the magnetic field concentrating members 3 must be separated from the upper surface of the magnetic pole 2 by a gap in the Y direction. However, this is not so. As can be understood from FIG. 4, because the grooves 5 and the magnetic field concentrating members 3 are arranged at different places in the Z direction, they can be arranged at the same height from the surface of the magnetic pole 2 in the Y direction.

Figure 5:
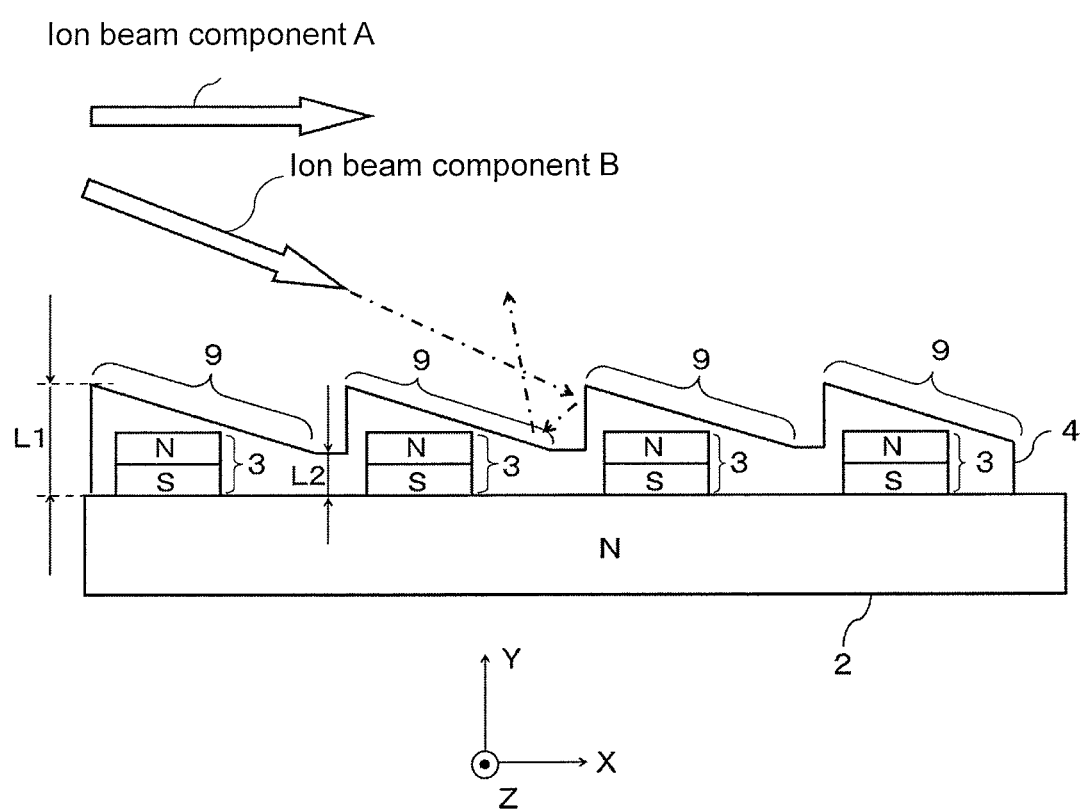
FIG. 5 is a drawing of a protective member according to yet another embodiment of the present invention in the XY plane.

FIG. 5 is a drawing of the protective member 4 according to yet another embodiment of the present invention in the XY plane. In the protective members 4 shown in all of FIGS. 1 to 4, a planar shape of the upper surface of the protective member 4 is parallel to the ZX plane. However, this need not always be the case.

When the ion beam 8 has a straight trajectory, ideally, all components of the ion beam 8 should have a straight trajectory. However, in reality, the ion beam 8 diverges due to a space charge effect. Therefore, the ion beam 8 consists of a component that proceeds straight as well as a component that diverges. In FIG. 5, the component of the ion beam 8 that proceeds straight is represented by component A, and the component of the ion beam 8 that diverges is represented by component B.

The protective member 4 may be sputtered by the component B of the ion beam 8. The sputtering of the protective member 4 will likely lead to exposure of the magnetic field concentrating members 3 being covered by the protective member 4.

Upon exposure, the magnetic field concentrating members 3 are sputtered by the ion beam 8, resulting in deformation of the magnetic field concentrating members 3, and the ensuing performance degradation. Furthermore, if the magnetic field concentrating members 3 are made of metal, there is a risk of metal contamination. Due to such problems the ion beam irradiation apparatus may not be operated stably over long periods of time.

As an improvement measure for the above-mentioned problems, a plurality of projecting sections 9 is provided in the protective member 4, as shown in FIG. 5. The projecting sections 9 form a continuous rib-like shape along the X direction. A height of each projecting section 9 from the surface of the magnetic pole 2 gradually decreases along the X direction, which is the designed traveling direction of the ion beam 8. For example, if a height of the projecting section 9 from the surface of the magnetic pole 2 in the X direction on an upstream side is L1 and on a downstream side is L2, then L1 should be set larger than L2. For example, the decrease from L1 to L2 along the X direction may be set based on a linear function. The magnetic field concentrating members 3 are arranged below the projecting sections 9.

With this structure, the component B, which is the component of the ion beam 8 that diverges, comes to collide with the projecting sections 9 of the protective member 4. Thus, the upper surfaces of the projecting sections 9 in the Y direction where the magnetic field concentrating members 3 are arranged remain safe from being worn out by the component B. Consequently, the possibility of the magnetic field concentrating members 3 being sputtered by the ion beam 8 can be minimized even if the ion beam irradiation apparatus is operated over long periods of time.

Furthermore, such a structure enables a certain proportion of the component B, which is the component of the ion beam 8 that diverges, to be removed from the ion beam 8. As indicated by dashed arrows in FIG. 5, the component B of the ion beam 8 collides with the highest part of the projecting section 9 and is reflected. The reflected component B of the ion beam 8 then collides with another part of the protective member 4, and is reflected again. Eventually, the component B of the ion beam 8 travels in the direction that is substantially opposite to that of the component A of the ion beam 8. As a result, the ion beam 8 that irradiates the target surface of the wafer or glass substrate includes substantially solely the component A of the ion beam 8. Consequently, a failure rate of manufacturing of semiconductor elements is improved.

Figure 6:
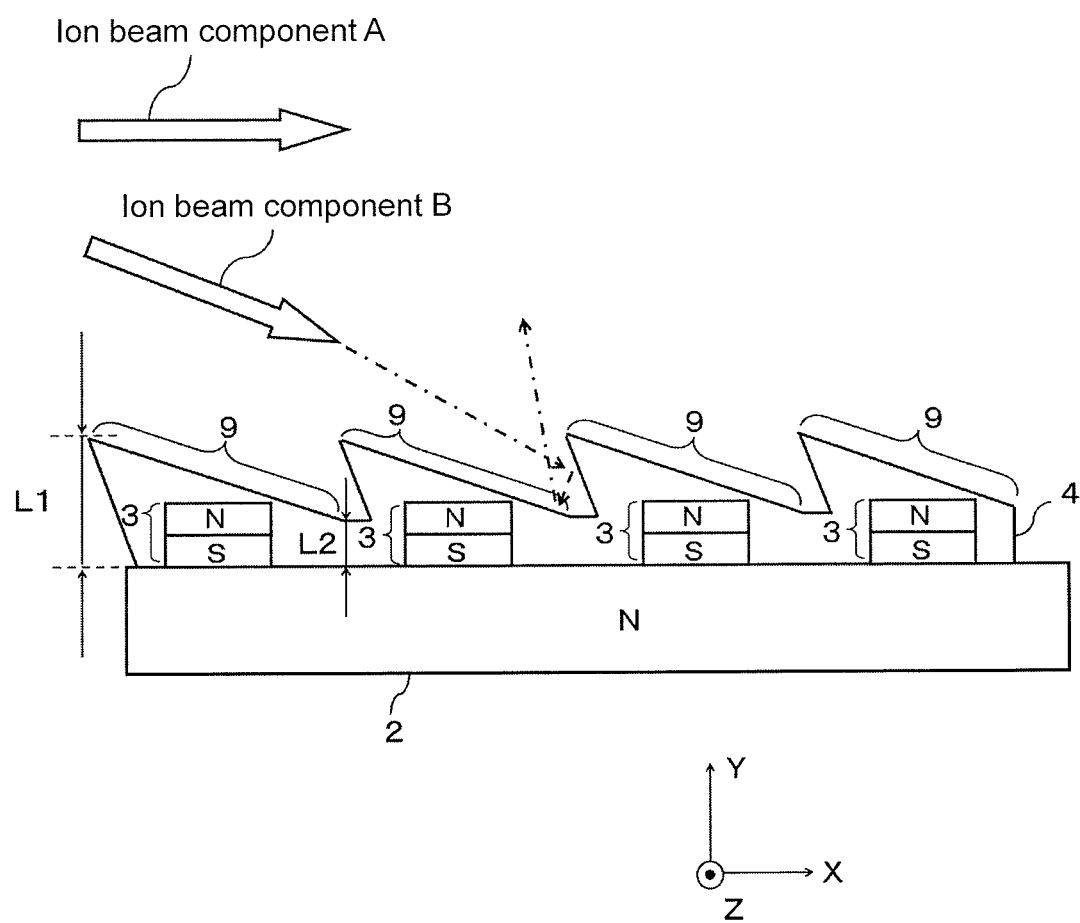
FIG. 6 is a drawing of a protective member according to yet another embodiment of the present invention in the XY plane.

FIG. 6 is a drawing of the projecting sections 9 shown in FIG. 5 according to another embodiment. In FIG. 5, the highest part of the projecting section 9 is perpendicular to the surface of the magnetic pole 2. However, the structure shown in FIG. 6 will yield identical result as that shown in FIG. 5, as long as the height of the projecting section 9 is made to gradually decrease in the X direction, which is the designed traveling direction of the ion beam 8.

In both FIGS. 5 and 6, the decrease of the height of the projecting section 9 from the surface of the magnetic pole 2 along the traveling direction of the ion beam 8 is set based on a linear function. However, the decrease in the height can be set based on a quadratic function.

Figure 7:
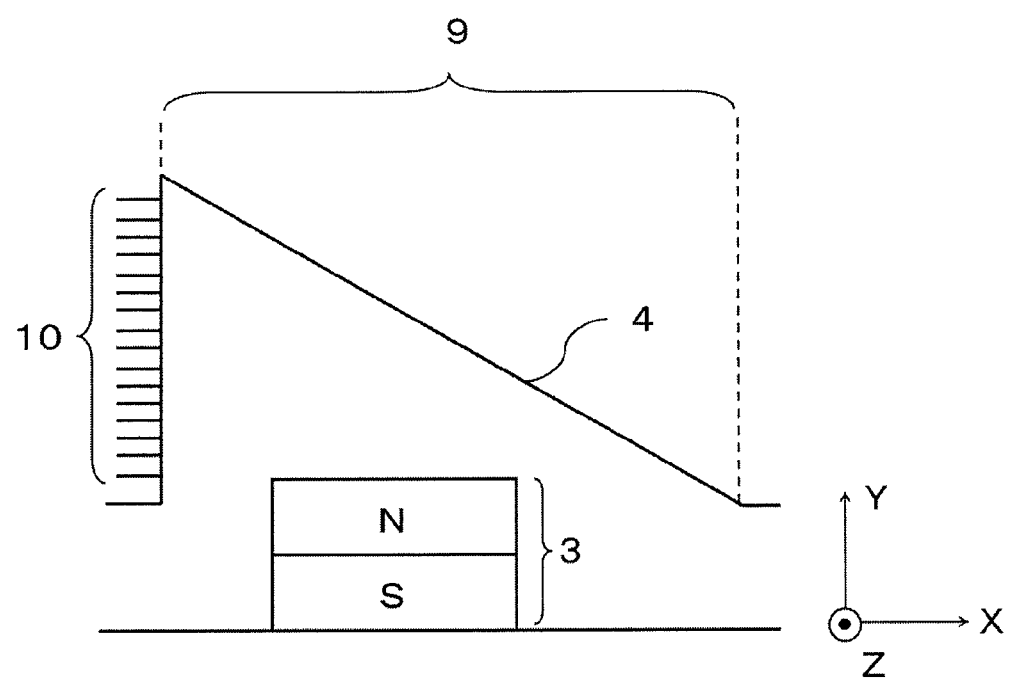
FIG. 7 is an enlarged drawing of key parts shown in FIG. 5.

FIG. 7 is an enlarged drawing of key parts of the projecting section 9 of FIG. 5. In FIG. 7, carbon nanotubes 10, finely cut into rings, are arranged on the surface of the projecting section 9 on the upstream side in the X direction. Because of the difficulty in mounting the carbon nanotubes 10 one by one on the projecting section 9, the carbon nanotubes 10 are first mounted on a sheet-shaped member made of carbon, etc., and this assembly is mounted as a unit on the projecting section 9.

With this structure, when the component B of the ion beam 8 shown in FIG. 5 collides with the carbon nanotubes 10, it can be anticipated that the component B will get trapped inside the carbon nanotubes 10 or between the carbon nanotubes 10. Consequently, the possibility of the component B of the ion beam 8 being reflected by the projecting section 9 of the protective member 4 is minimized.

Even if the component B of the ion beam 8 does get reflected, a speed of the reflected component B is much reduced due to its collision with the carbon nanotubes 10 compared to a speed of the reflected component B in the absence of the carbon nanotubes 10. Consequently, the possibility of the component B of the ion beam 8 reflected by the projecting section 9 reaching the wafer or glass substrate, which is the target of irradiation can be reduced.

The carbon nanotubes 10 shown in FIG. 7 can likewise be mounted on the projecting section 9 shown in FIG. 6.

In the case of the projecting section 9 of FIG. 6, the carbon nanotubes 10 should preferably be arranged at a place where the component B of the ion beam 8 shown in FIG. 6 collides. That is, the carbon nanotubes 10 should be arranged at the place where the component of the ion beam 8, that is not parallel to the X direction, collides. Because the ion beam 8 can vary widely, the carbon nanotubes 10 could well be provided on the entire surface of the projecting section 9.

The magnetic pole 2 shown in FIG. 1 is rectangular. However, it can have a complex curved shape as shown by dashed line in FIG. 8.

For such a magnetic pole 2 having a complex shape, it would be difficult to attach by a single protective member 4 to slide over to cover the entire surface of the magnetic pole 2. That is, if a single protective member 4 is slid over to cover the magnetic pole 2 of the shape shown in FIG. 8, the protective member 4 will get stuck in the middle.

As a solution to this problem, a single rectangular protective member 4 that covers the entire surface of the magnetic pole 2 can be used but with the shape of the holding member 6 altered to overhang outward from side surfaces of the magnetic pole 2 in the Z direction while maintaining the shape of the protective member 4. However, this would mean that the sizes of the holding member 6 and the protective member 4 will both have to be made large, resulting in increasing the overall size of the apparatus.

Figure 8:
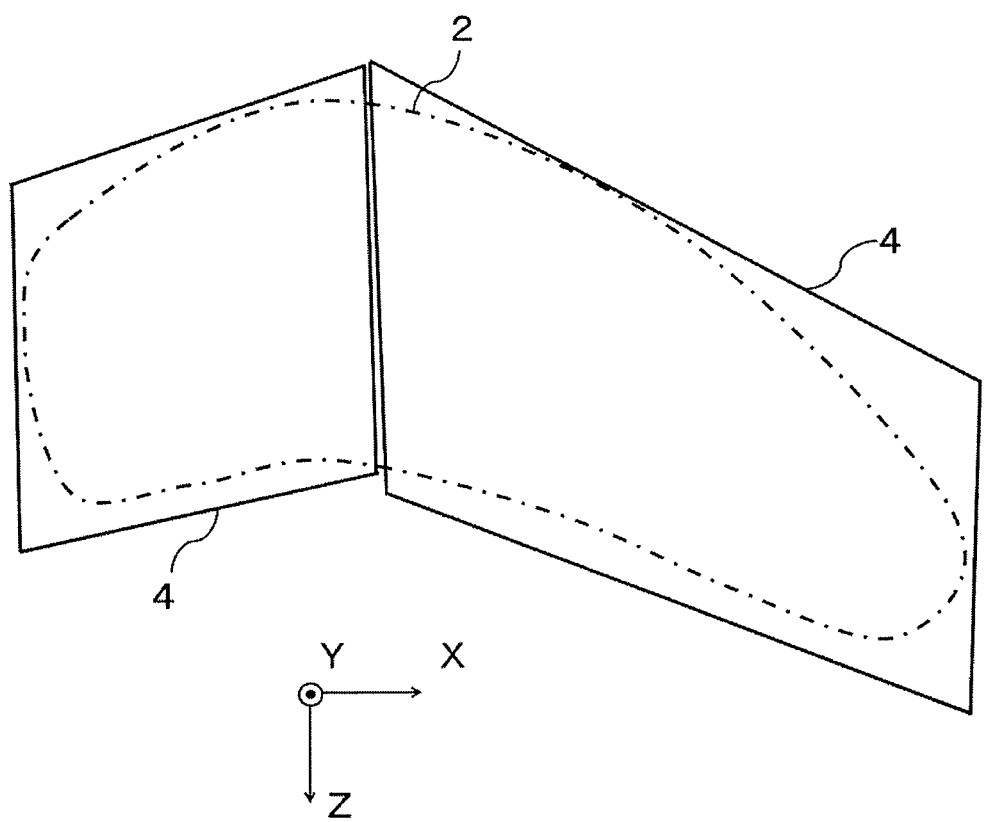
FIG. 8 is a schematic drawing illustrating a surface of a magnetic pole being covered by a plurality of the protective members.

Therefore, as a solution to a problem that arises due to a complex-shaped magnetic pole 2, the large protective member 4 that covers the entire surface of the magnetic pole 2 can be divided into a plurality of the protective members 4. In FIG. 8, the protective member 4 that is divided into two has been shown.

Figure 9:
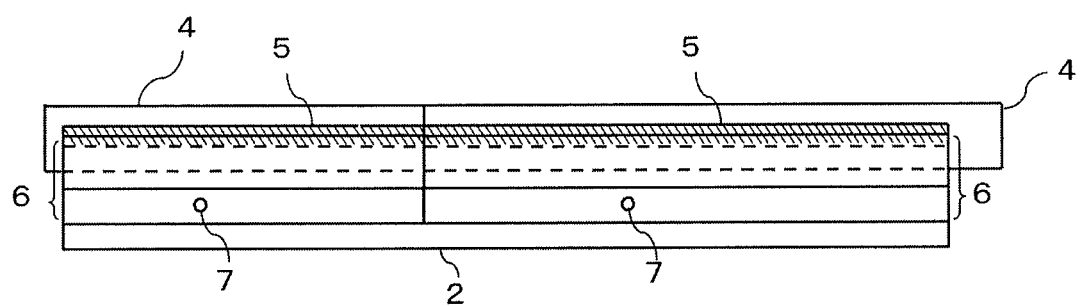
FIG. 9 is a schematic view of FIG. 8 in the XY plane.
Figure 9:
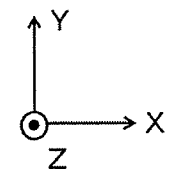
Figure 10:
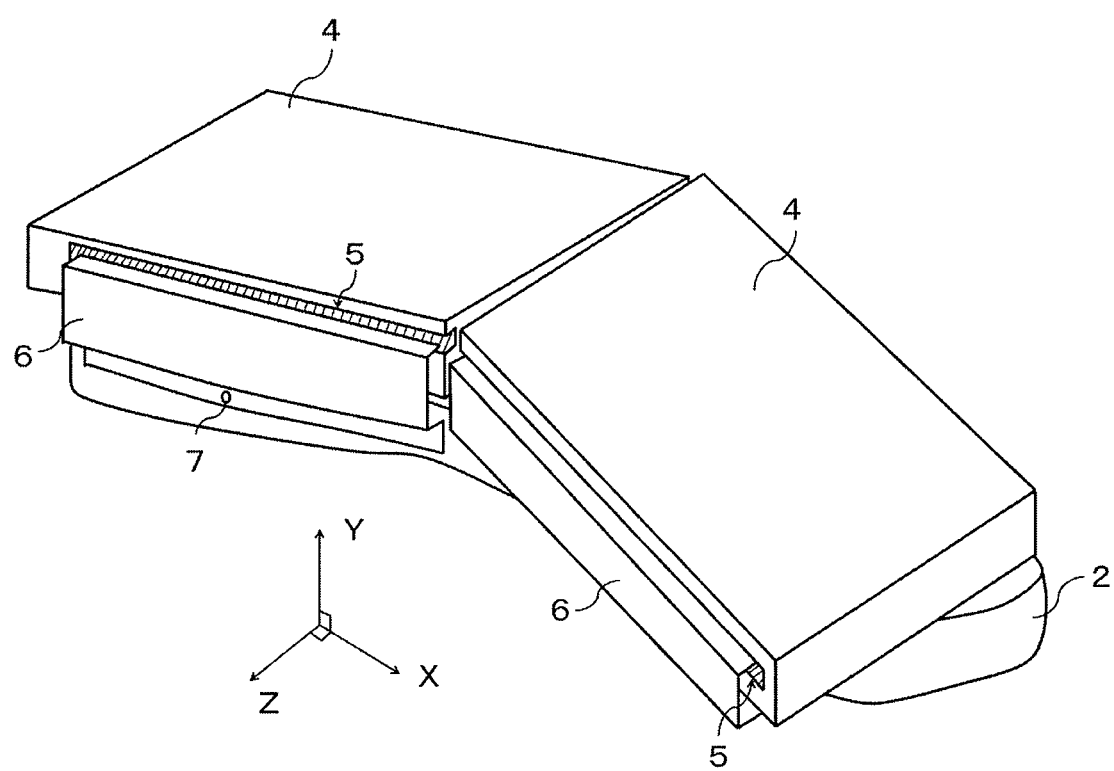
FIG. 10 is a perspective view of FIG. 9.

FIG. 9 is a schematic view of FIG. 8 in the XY plane. In each of the two protective members 4, a separate groove 5 is provided on each side surface in the Z direction. Furthermore, the holding member 6 is also provided separately for each of the protective members 4. The protective member 4 that is on the upstream side in the X direction (the protective member 4 on the left) is attached to the magnetic pole 2 by being slid in the X direction, while the protective member 4 that is on the downstream side in the X direction (the protective member 4 on the right) is attached to the magnetic pole 2 by being slid in the opposite direction to the X direction. FIG. 10 is a perspective view of FIG. 9 for a more clear illustration of the above explanation.

Figure 11:
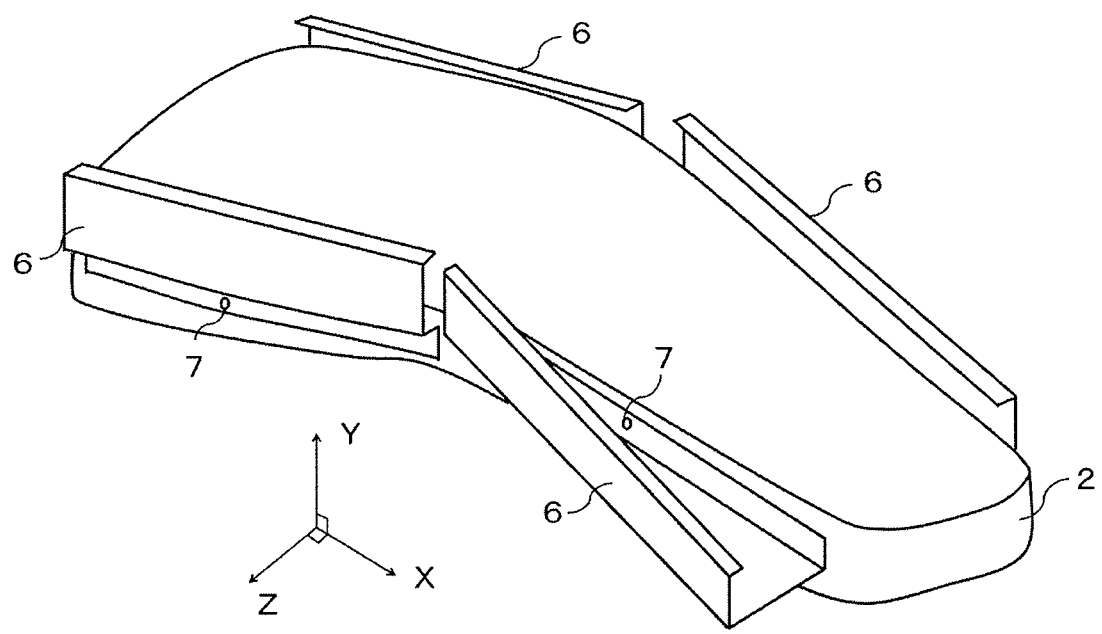
FIG. 11 is a perspective view of FIG. 10 without the protective members.

FIG. 11 is a perspective view for a clearer illustration of the structure of the holding members 6. The protective members 4 of FIG. 10 have not been shown in FIG. 11 for an unhindered view of the holding members 6. As shown in FIG. 11, the shape of the holding members 6 substantially follows the shape of the magnetic pole 2. Each pair of the holding members 6 opposed to each other on either side of the magnetic pole 2 is parallel in the length direction thereof.

Thus, in the case of complex-shaped magnetic poles, problems of attachment and increased apparatus size arising from using a single protective member can be eliminated by using a plurality of the protective members 4.

Figure 12:
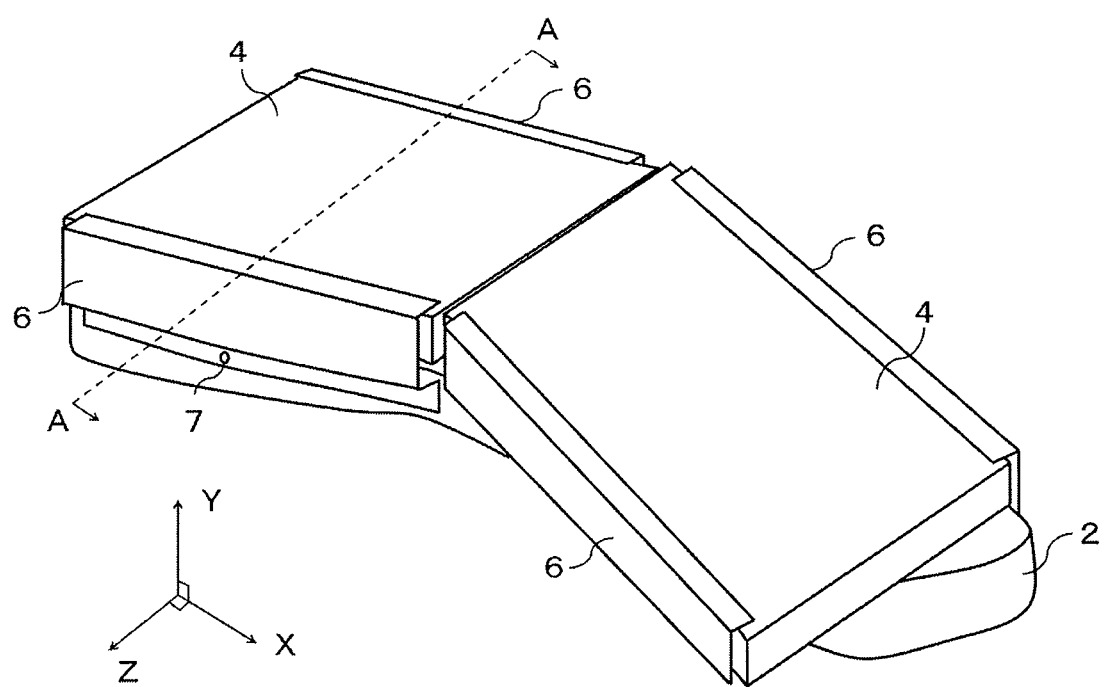
FIG. 12 is a drawing of a holding structure according to yet another embodiment of the present invention.

FIG. 12 is a drawing of a holding structure of the protective member 4 according to yet another embodiment of the present invention. In the structures according to the embodiments so far, the grooves 5 are provided in the protective member 4. However, in the present embodiment, the entire protective member 4 is slid into a space between the holding members 6 and the magnetic pole 2. Therefore, there is no need for providing the grooves 5 in the protective member 4. Thus, labor and time required for the provision of the grooves 5 can be saved.

Figure 13:
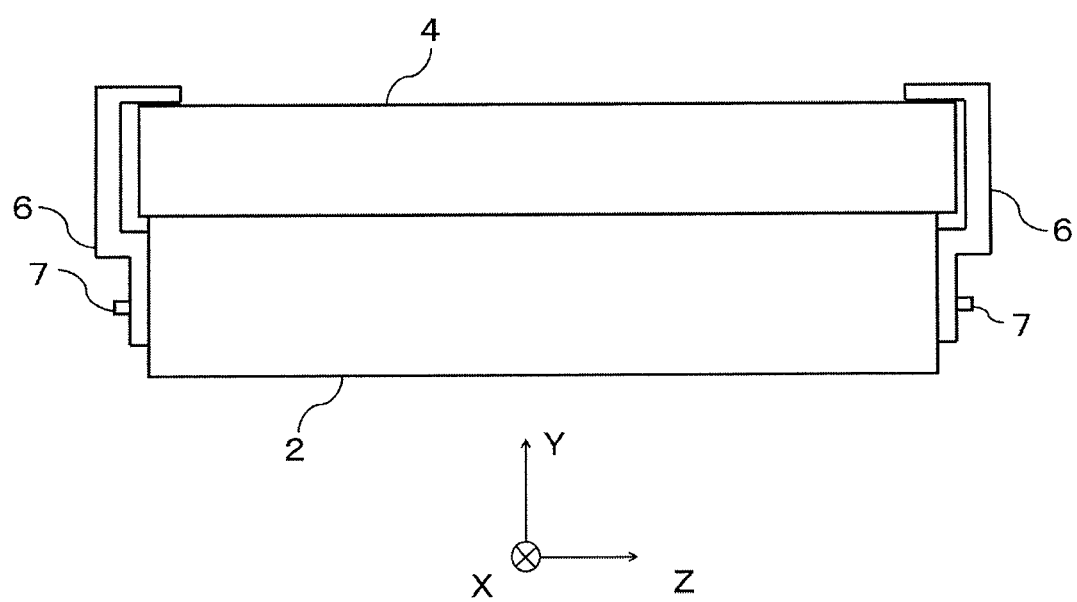
FIG. 13 is a sectional view of FIG. 12 in a Y direction along a line A-A.

FIG. 13 is a sectional view of FIG. 12 in the Y direction along a line A-A. FIG. 13 clearly illustrates how the protective member 4 is slid into the space between the magnetic pole 2 and the holding members 6.

In the example shown in FIGS. 12 and 13, a portion of the holding members 6 on the upper surface of the protective member 4 is exposed. The exposed portion of the holding members 6 is at a risk of being sputtered by the ion beam 8, resulting in the particles thereof contaminating the wafer or glass substrate being irradiated. Therefore, by using the holding member 6 made of carbon, which is the same material used in the protective member 4, or made of the same material as that of the substrate being irradiated, an amount of sputter can be reduced and the effect of contamination can be minimized. Another way of reducing sputtering of the holding members 6 by a certain degree apart from using an appropriate material is by devising an appropriate holding structure.

Figure 14:
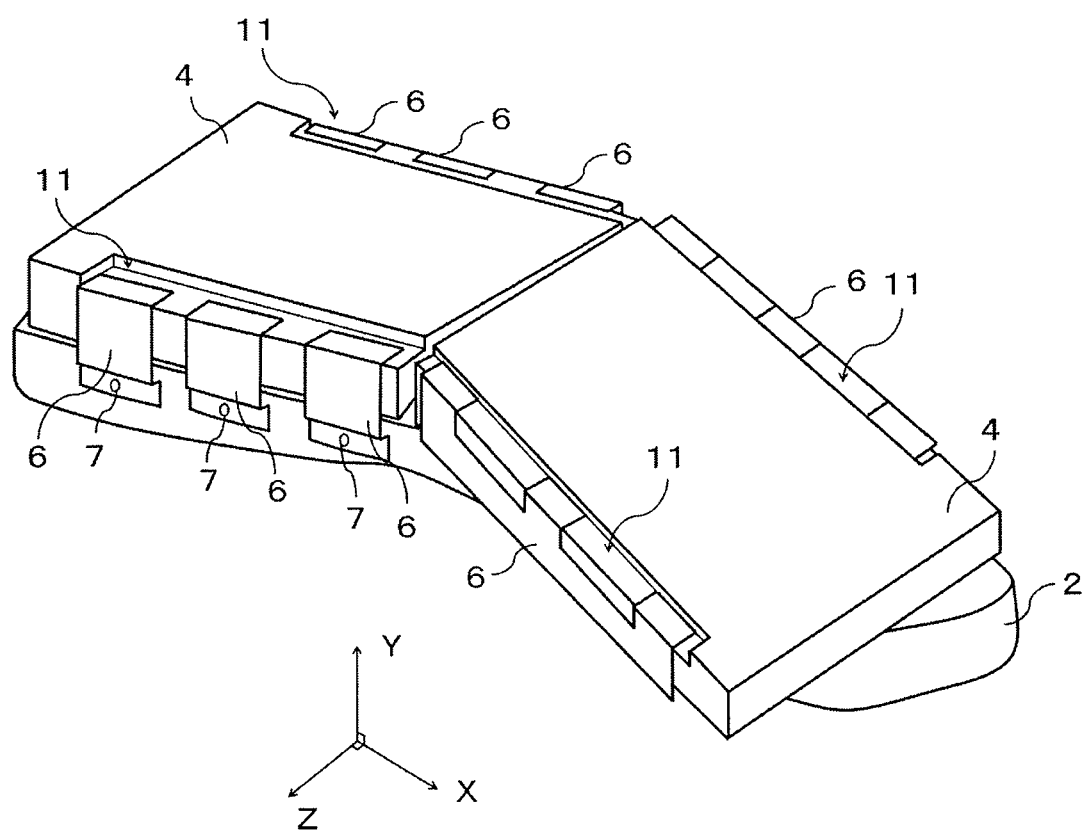
FIG. 14 is a drawing of a holding structure according to yet another embodiment of the present invention.

FIG. 14 is a drawing of such a holding structure. A depressed portion 11 is provided on either edge of the protective member 4, and the edges of the holding members 6 are arranged in the concave portion 11. Thus, because the holding members 6 are away from the upper surface of the protective member 4 by a depth of the concave portion 11, they are less likely to be sputtered by the ion beam 8.

Alternatively, a surface area of the holding members 6 that is exposed on the upper surface of the protective member 4 can be decreased. In the example shown in FIG. 14, the exposed edges of the holding members 6 in the X direction are not continuous. Furthermore, three small holding members 6 can be used for holding the protective members 4 as shown in FIG. 14 on the upstream side in the X direction. Alternatively, as shown in FIG. 14 on the downstream side in the X direction, a single holding member 6 that trifurcates across the concave portion 11 of the protective member 4 can be used. In the example shown in FIG. 14 too, the protective member 4 is attached to the magnetic pole 2 by sliding in the manner illustrated in FIG. 12.

The magnetic field concentrating members 3 are not shown in FIGS. 8 to 14 because these figures essentially explain how the protective member 4 is attached to the magnetic pole 2. If the magnetic field concentrating members 3 are arranged on the magnetic pole 2 as separate entities from the protective member 4, for example, when the protective member 4 is attached to the magnetic pole 2 by sliding, a bottom surface of the protective member 4 slips over the top of each of the magnetic field concentrating members 3. If the magnetic field concentrating members 3 are provided integral with the protective member 4, for example, the bottom surface of the protective member 4 slips over the top of the magnetic pole 2.

The magnet according to the present invention and the magnetic poles, the magnetic field concentrating members, the holding members, etc. thereof have been described with respect to specific embodiments. However, they can be improved and modified without departing from the spirit of the invention. Moreover, the magnet 1 according to the present invention can be a permanent magnet or an electromagnet. Furthermore, the ion beam irradiation apparatus according to the present invention can be any apparatus as long as it is a device such as an ion implanter or an ion beam aligner, and irradiates a substrate such as a silicon wafer or a glass substrate with an ion beam having a positive charge.

What is claimed is:

1. A magnet used in an ion beam irradiation apparatus, the magnet comprising:
    a pair of magnetic poles arranged facing each other on an inner side of the magnet across an ion beam;
    a plurality of magnetic field concentrating members, each of the plurality of magnetic field concentrating members comprising magnets, that are arranged on each of the opposing surfaces of the magnetic poles and that perform a function of reflecting electrons between the magnetic poles; and
    a protective member that covers opposing surfaces of the magnetic field concentrating members,
    wherein the protective member comprises a single protective member that is integrally formed over all of the magnetic field concentrating members, and further wherein a direction of a magnetic field generated by the pair of the magnetic poles is substantially the same as a direction of a magnetic field generated by the magnetic field concentrating members, between the magnetic poles, and the poles of the each of the magnetic field concentrating members are commonly oriented in the direction of the magnetic field generated by the pair of the magnetic poles.

2. The magnet according to claim 1, wherein, assuming an XYZ orthogonal coordinate system in which a designed traveling direction of the ion beam passing between the magnetic poles to be an X direction, a direction in which the magnetic poles are arranged to be a Y direction, and a direction that is orthogonal to both the X direction and the Y direction to be a Z direction, a groove is formed in each of two side surfaces of the protective member that intersect with the Z direction, and
    the magnet further comprising a holding member that includes a first end and a second end, the first end being fixed to the magnetic pole and the second end being inserted into the groove in the protective member.

3. The magnet according to claim 1, wherein the protective member has a concave portion formed on a surface thereof that faces the ion beam, and
    the magnet further comprising a holding member that includes a first end and a second end, the first end being fixed to the magnetic pole, and the second end being arranged in the concave portion.

4. The magnet according to claim 1, wherein a projecting member is formed in the protective member, with a height thereof from a surface of the magnetic pole that faces the ion beam gradually decreasing in the designed traveling direction of the ion beam passing between the magnetic poles.

5. The magnet according to claim 1, wherein the protective member includes a plurality of members.

6. The magnet according to claim 1, wherein the protective member slips over a top of the magnetic poles.

7. The magnet according to claim 1, wherein the magnetic field concentrating members generate a mirror magnetic field inside the magnet.

8. The magnet of claim 1, wherein the protective member is positioned between the respective ends of opposing surfaces of the magnetic field concentrating members and substantially horizontal to a travel direction of the ion beam.

9. The magnet of claim 1, wherein the plurality of magnetic field concentrating members comprise a plurality of spaced-apart permanent magnets.

\* \* \* \* \*